United States Patent
Lerner

(10) Patent No.: US 7,588,948 B2
(45) Date of Patent: Sep. 15, 2009

(54) TEST STRUCTURE FOR ELECTRICALLY VERIFYING THE DEPTHS OF TRENCH-ETCHING IN AN SOI WAFER, AND ASSOCIATED WORKING METHODS

(75) Inventor: Ralf Lerner, Erfurt (DE)

(73) Assignee: X-FAB Semiconductor Foundries AG, Efert (DE)

( * ) Notice: Subject to any disclaimer, the term of this patent is extended or adjusted under 35 U.S.C. 154(b) by 92 days.

(21) Appl. No.: 10/552,984

(22) PCT Filed: Apr. 19, 2004

(86) PCT No.: PCT/DE2004/000815

§ 371 (c)(1),
(2), (4) Date: Sep. 25, 2006

(87) PCT Pub. No.: WO2004/095570

PCT Pub. Date: Nov. 4, 2004

(65) Prior Publication Data

US 2007/0054422 A1      Mar. 8, 2007

(30) Foreign Application Priority Data

Apr. 17, 2003  (DE) ............................... 103 17 748

(51) Int. Cl.
*H01L 21/00* (2006.01)
(52) U.S. Cl. .................. 438/16; 257/E21.522
(58) Field of Classification Search .............. 438/14, 438/401, 16; 257/E21.522
See application file for complete search history.

(56) References Cited

U.S. PATENT DOCUMENTS

| 6,057,171 | A  | 5/2000  | Chou         |
|-----------|----|---------|--------------|
| 6,071,822 | A  | 6/2000  | Donohue et al. |
| 6,127,237 | A  | 10/2000 | Tsuchiaki    |
| 6,275,297 | B1 | 8/2001  | Zalicki      |
| 6,291,254 | B1 | 9/2001  | Chou         |
| 6,306,755 | B1 | 10/2001 | Zheng        |
| 6,312,963 | B1 | 11/2001 | Chou         |
| 6,342,401 | B1 | 1/2002  | Tom          |

(Continued)

FOREIGN PATENT DOCUMENTS

EP    1 184 902 A1    3/2002

(Continued)

*Primary Examiner*—W. David Coleman
(74) *Attorney, Agent, or Firm*—Greenblum & Bernstein, P.L.C.

(57) ABSTRACT

The invention provides a simple to implement and reliable recognition of the moment at which insulation trenches reach the buried insulating layer during an etch process. The technological reliability during the etching of such trenches is increased, the production of refuse is prevented, and costs are reduced. To these ends, the invention provides a test structure for verifying an insulation trench etching in an SOI wafer. After an etching o insulation trenches, the test structure has a row of connected islands, whereby each island is surrounded by a trench. This trench has a different width form island to island (A,B; B,C) while including a trench width that appears the form of an insulation trench in an active circuit. A section of the surrounding trench (a,b) of each island (A,B) forms a common piece with the trench of adjacent islands. The respective section has, in the inner islands, the width of the adjacent trench having the next larger or the next smaller measure of width in the row.

27 Claims, 2 Drawing Sheets

U.S. PATENT DOCUMENTS

| | | |
|---|---|---|
| 6,396,076 B1 | 5/2002 | Tom |
| 6,403,389 B1 | 6/2002 | Chang et al. |
| 6,770,213 B2 | 8/2004 | Antaki et al. |
| 6,821,865 B2 * | 11/2004 | Wise et al. ................. 438/435 |
| 6,849,521 B2 | 2/2005 | Arita et al. |
| 2002/0088769 A1 | 7/2002 | Antaki et al. |
| 2002/0097405 A1 * | 7/2002 | Kishimura .................. 356/625 |
| 2002/0146867 A1 | 10/2002 | Salvatore |
| 2006/0292825 A1 * | 12/2006 | Lerner ........................ 438/459 |

FOREIGN PATENT DOCUMENTS

| | | |
|---|---|---|
| EP | 1 220 312 A1 | 7/2002 |

\* cited by examiner

TEST STRUCTURE FOR ELECTRICALLY VERIFYING THE DEPTHS OF TRENCH-ETCHING IN AN SOI WAFER, AND ASSOCIATED WORKING METHODS

BACKGROUND OF THE INVENTION

1. Field of the Invention

The invention relates to a test structure and methods for verifying of isolation trench-etchings (trench etchings) in SOI wafers.

2. Description of Background and Other Information

For integrating logic elements at a low voltage level and high voltage power elements into the same silicon circuit it is necessary to insulate die regions having significantly differing potentials from each other. One option is the dielectric insulation using etched re-filled trenches (trench isolation). To this end a vertically acting insulation between the device and the substrate is realized by means of a buried (horizontal) insulating layer (typically comprised of silicon dioxide, while generally other insulating layers may be used). A laterally acting insulation is obtained by etching a trench to the buried insulating layer and subsequently re-filling the deep trench with insulating layers or with a single insulating layer (isolation trench).

Alternatively, only a portion of the etched trench may be filled with the insulating material. The remaining portion is filled with a conductive fill layer comprising, for instance, polysilicon. By a subsequent planarization, a so-called planarization step, for instance, an appropriate etch process or a chemical mechanical polishing (CMP) process, a planarization of the surface is accomplished, in this respect refer to the representation in FIG. 3 (prior art).

In known techniques various problems may arise with respect to the depth. In order to achieve electric insulation in the lateral direction, that is, from one insulated island to a adjacent insulated island, it has to be guaranteed that the isolation trench extends to the buried oxide. A typical conventional technique is hereby pushed to its physical limits. An endpoint detection based on the etch composition of the etch plasma (oxygen ions are present within the etch plasma when the buried oxide layer is reached) fails when the fraction of the area etched is too small.

Optical techniques are becoming increasingly difficult, when the aspect ratio, i.e., the ratio of width and depth, is too small, that is, for narrow deep trenches.

On the other hand, etching too long causes, due to back scattering of etch ions, an etch attack at the lower sidewalls of the etched trenches and should be avoided if possible.

Additionally, in view of a desirably high tool throughput during the manufacturing of SOI wafers including logic devices and power devices the etch time may not be extensively long.

SUMMARY OF THE INVENTION

The present invention provides a reliable method easy to be handled in order to determine the point in time when isolation trenches are fully etched to the buried insulating layer. Hereby, the technological reliability of the etching of these trenches should be enhanced, defective products avoided and costs reduced. Alternatively, the present invention may enable the verification of the depth of trenches obtained during an etch process by means of a test structure without requiring the precise measurement of the depth.

Pursuant to the foregoing, present invention includes a test structure. A row of connected islands is configured such that each island is surrounded by a trench after the etch process. The trench has a step-wise different width from one island to the other, thereby including a width used in the active circuit. The surrounding trench of each island shares a portion with the trench of the adjacent island. This portion (or section) has a different width, which is the width of the trench having the next larger or the next smaller measure in the row.

The respective common section of the trenches of the respective adjacent (downwardly) island has the measure of width of the next narrower trench. The respective common section of the trenches of the respective adjacent (upwardly) island has the measure of width of the next broader trench. Also, a mixture of different widths along the row of trenches may be set via the mask (may be prepared by means of a mask).

Under most conditions the etch rate depends to a certain degree on the width of the trenches to be etched. The broader the trench the better is an exchange of the etch species and the higher is the etch rate. Hence, based on an appropriate process control and an appropriate layout of the widths, respectively, the broader trenches are already fully etched (to the buried insulating layer), while the narrower trenches or the narrow trenches are not yet completely etched down to the buried insulating layer.

By means of an electric measurement between two adjacent islands across the common isolation trench (disposed in between) testing and controlling may be performed with respect to a sufficiently deep etching. The measurement of the "electric pass" may include the conductivity, the resistance or the resulting current caused by a fixed voltage or the resulting voltage caused by a fixed current. All of these items represent a technical type of electric pass.

With a still insufficient depth of the etching process, i.e., when the respective isolation trench has not yet reached the buried insulating layer, a current flow increased by some orders of magnitude or a reduced resistance may be observed compared to an already sufficient depth of the etched trench having already reached the buried insulating layer.

The conductivity or the resistance are measured successively between the individual islands, starting with the islands of the narrowest trench and/or between a respective island and the surrounding region of the semiconductor substrate, for example. In this way, it may be determined which of the isolation trenches is already etched through (down to the buried insulating layer) and which is trench is not.

By means of such a test structure a deep etching may be tested whether the trenches completely etched (all trenches having a width greater than the trench of the active circuit that is indicated as a reference trench) and also the reference trench itself are etched down to the insulating layer. The remaining trenches, i.e., the trenches having a width less than the reference trench are not completely etched, thus not yet reaching the buried insulating layer.

In this manner unduly long etch times may be avoided. These undue etch times would occur if the trenches formed with a smaller width compared to the reference trench would completely be etched.

BRIEF DESCRIPTION OF THE DRAWINGS

The invention will be explained and supplemented by means of an illustrative embodiment, whereby.

DETAILED DESCRIPTION OF THE INVENTION

Figure 1A:
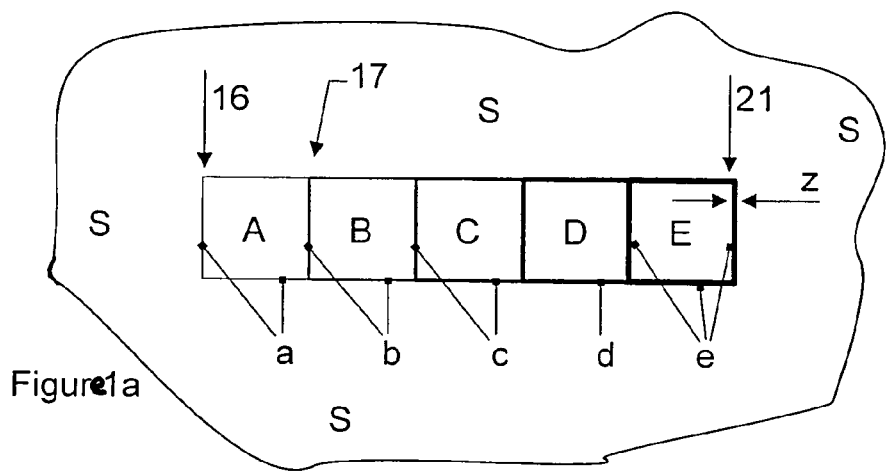
FIG. 1a schematically depicts a test structure in a top view.
Figure 1B:
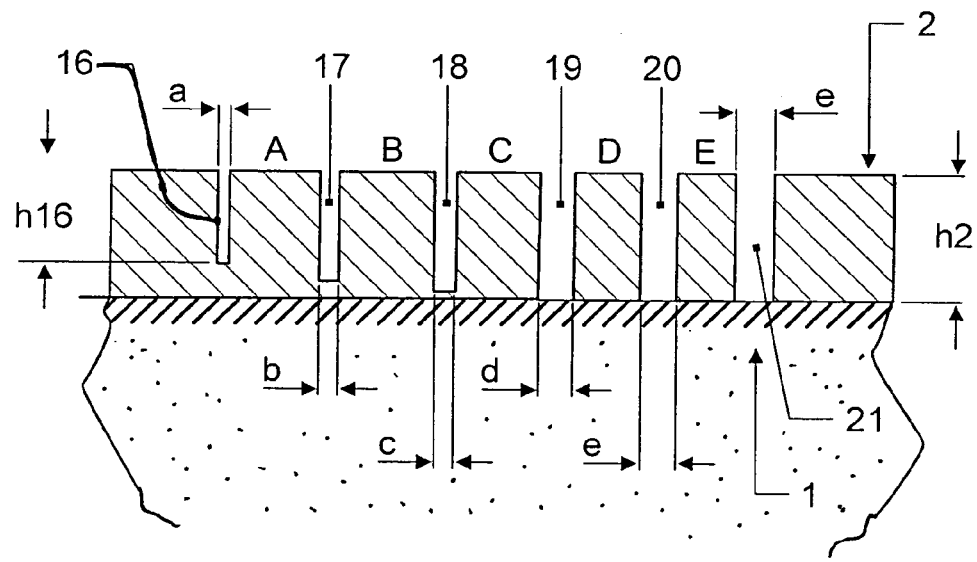
FIG. 1b is a cross-sectional view of the test structure of FIG. 1a, wherein isolation trenches are already present after a certain etch time.

FIGS. 1a and 1b illustrate as a top view and a cross-sectional view, respectively, a row of continuous square-shaped island regions A to E. The perimeters of the island regions indicate the isolation trenches 16 to 20 having a different width after the etch process. The trench widths a to e between the individual islands increase from island A to island E. Hence, the etch rate also increases corresponding to the trenches formed. The etch rate $\Delta y/\Delta t$ is set in advance by means of the width z of the opening of a mask.

Figure 3:
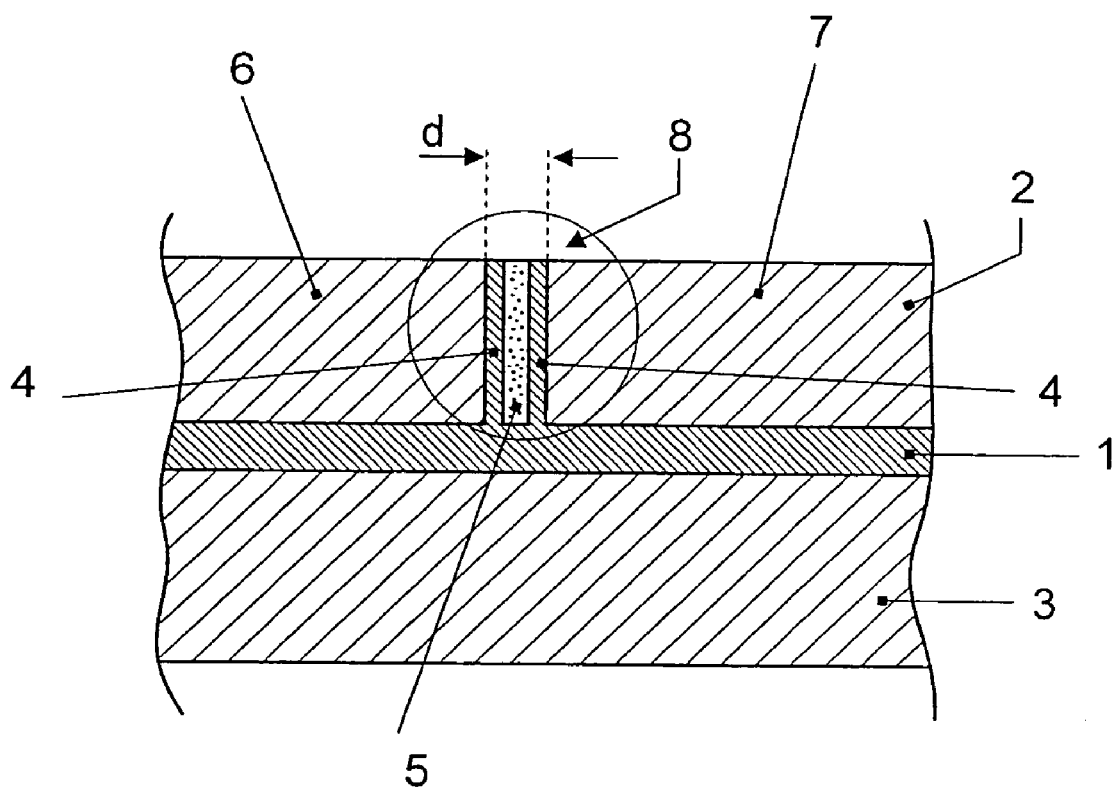
FIG. 3 represents a trench in an active circuit in the SOI.

An insulating layer 1 is formed, for instance, as silicon dioxide, and supports the active semiconductor layer 2. This semiconductor may be, for example, silicon. A carrier substrate below the insulating layer 1 is indicated in dotted lines. The insulating layer then represents a BOX layer (buried oxide). In FIG. 3, it is referred to in a symbolic manner.

Each of the islands is surrounded by trenches. Each trench has a different width, and the width of the trenches a to e, which is generally represented by z, increases from left to right in FIGS. 1a, 1b, that is, z=a to e, where, e>d, d>c, c>b, etc. (from right to left).

The remaining substrate region surrounding the trenches or the islands is denoted as S.

The widths of the trenches 16 to 21 in FIG. 1b are indicated in the cross-sectional representation as a to e, where e is greater than a.

A section of an isolation trench already filled and disposed in a carrier substrate is illustrated in FIG. 3 as a "handle wafer". This configuration is per se known and is merely explained here in order to provide an exemplary illustration for the reference trench or the width, that is, the depth of the reference trench resulting from the etching process of the active circuit.

The handle wafer comprises a carrier substrate 3, a buried insulating layer 1 in the form of a BOX, which may be silicon dioxide, and an active silicon layer 2. The active layer is also frequently referred to as a "device wafer" or device substrate. In this device wafer is provided a trench structure 8 in the form of an insulation trench (isolation trench) having two insulating layers 4 provided laterally at the left and right sides and having an initial width d for an insulation. The left and right regions 6 and 7, both of which may be active silicon areas and which may be at different potentials, for example, a high voltage for a power device and a control voltage for this power device, respectively, are insulated. The vertical insulation is provided by the BOX, the horizontal insulation is provided by the two insulating layers 4. They are filled in between with a possibly conductive fill layer 5 and extend to the BOX layer.

The surface of the device is planarized by means of a removal or a polishing process.

Illustrated is the depth of the trench structure having a width d, which is not yet provided with the insulating layers 4 and the fill layer 5 and which extends down to the BOX such that the horizontal insulation cooperates via the insulating layers provided at this time with the vertical insulation (the BOX layer 1) so as to commonly provide a horizontal-vertical insulation. The regions 6 and 7 are completely insulated from each other. The insulation corresponds to the resistance against break-through (thickness and construction) of the insulating layers 4 and 1.

The test structure of FIG. 1a in a top view enables the testing of the etchings of the isolation trenches with respect to, for instance, the described trench configuration 8 according to FIG. 3. The test structure is located at a different position of the SOI substrate.

At the non-etched state, FIG. 1a may define the mask openings, which subsequently will result in etch depths that will have a configuration after the predefined etch time as is illustrated in the cross-sectional view of FIG. 1b.

Here, two etch depths should be described, which may be recognized on the basis of the heights h16 and h2. The thickness of the device wafer h2 is reduced within the trenches 19, 20 and 21 down to the BOX layer 1. Thus, this etch depth is h2. The etch depth in the narrower trench 16 surrounding the island A is h16. There remains a bottom web h2-h16 of the device wafer, as is the case for the step-wise broader trenches 17 and 18 having the widths b and c, respectively.

The continuous row of islands A to E are associated with each other and are separated by a trench. Thus, they are continuous in the sense that they are functionally associated, wherein, however, each island is separated from the other island by at least one trench section. In the case of square-shaped islands, one square-shaped trench surrounds a respective island and one section of the one island and a different section of the next trench of the next island represent a common portion.

Since each island is surrounded by a trench of different width the commonly shared section of the trench may have a width that either corresponds to the width of the broader trench or to the width of the narrower trench. The width of the respective trench increases from the left to the right in FIG. 1a. The commonly shared section between respective two adjacent islands is here dimensioned such that the broader trench separates the adjacent islands, that is, the trench width b separates the islands A and B, although island A only has the trench width a as a separation from the remaining substrate region S. Thus, the substrate region S surrounds island A at three sides, while surrounding island B only at two sides. Both cases represent an at least partial surrounding of each island with respect to the substrate region S.

It is evident that the broadest trench width "e" is already obtained between the islands D and E so that the right trench section having the numeral z (generally used for the trench width) is no longer broader compared to the left trench section e located between the islands D and E.

The width increases step-wise from the left to the right for each island. A section of the trench surrounding a respective island comprises the part described above that is commonly shared with the neighboring island. This respective part has a width corresponding to the width of the trench of the (right) neighboring island, when viewed from the right to left in FIG. 1a. A consideration and usage from the right to the left is also possible. In this case, the trench located between the islands D and E has the smaller width, i.e., the width "d" of that trench that surrounds the island D. Then, the trench section between the islands A and B has the width a and not the width b.

For the inner islands B to D that are not located at the end of the series (islands A and E) the trench width in the commonly shared trench section is thus determined either by the respective one or the adjacent trench width.

One of the widths a to e corresponds, at least substantially, to a trench width of the active circuit, in this example the trench width d of the (still unfilled and laterally not yet insulated) trench structure 8 of FIG. 3. Thus, trench 19 is obtained as a reference trench that also has the width d. When etched down to the oxide layer 1 during the etch process, this also corresponds an appropriate etch depth in the active circuit between the islands 6, 7 to be insulated in the active "device substrate".

In a method for testing the isolation trench structure the test structure according to FIG. 1a may be used, after the etch process the test structure according FIG. 1b may be used. It is formed on the process wafer and the electric resistance may be measured between each two adjacent islands according to FIG. 2, in order to obtain an assessment of the sufficient or appropriate depth of the etched isolation trenches relating to active "device substrate" by means of the magnitude of the values (measurement values).

Figure 2:
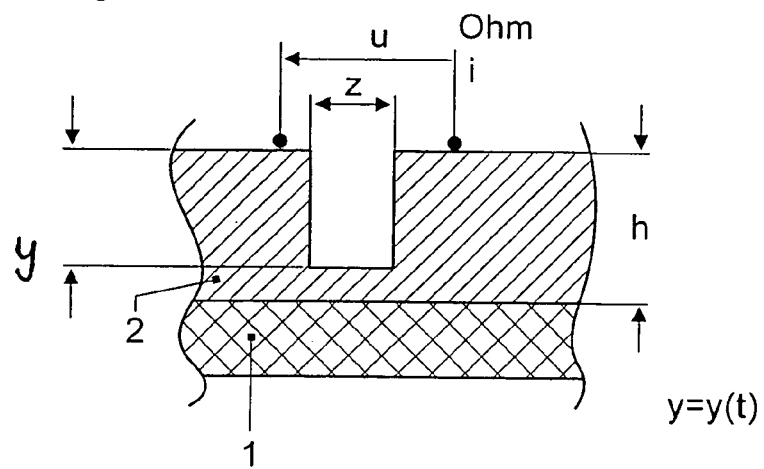
FIG. 2 represents the electric measurement from one island to another across a test trench illustrated in a enlarged view that is not yet completely etch and that has an aspect ratio of z/y (width to depth).

FIG. 2 illustrates in this respect two electrodes, which are symbolically applied to two island regions. These two islands are adjacent to each other and are separated by a trench. It may be each of the trenches in FIG. 1a and each of the pairs of islands that are adjacent to each other. The resistance across the electrodes resulting between these two islands is measured. The electric pass in the form of either current, resistance or conductance, or the conductivity behavior at a fixed drive current and measured voltage across the electrodes, yields measurement values. These measurement values relate to the remaining thickness of the "device substrate" under the trenches already etched and having the depth y, whereby y is a function of time, y(t), and the rate with which the depth of the trench is etched is a function of the width z. The depth y of the trench is thus a function of z, that is, y=y(z). The resulting measurement values of the pass, for instance, the resistance, demonstrate which trench is already etched down to the oxide layer. The trench 19 would result in a very high resistance for a measurement between the islands C and D, while a measurement between the islands A and B, that is, across the remaining fin below the trench 17, would result in a significantly smaller resistance for the electric measurement.

The electric measurement is performed successively, that is, for all adjacent pairs of islands, not necessarily subsequently, however, not simultaneously for all adjacent islands.

Instead of measuring between two adjacent islands the measurement may be performed between a respective island and the substrate surface, which surrounds the respective island at least at two or three sides.

The measurement may be performed after an etch process in order to obtain information about the used time period of the etch process and the achieved result by electrically measuring the test structure. The etch process may also be interrupted after an etch step to allow a measurement and to monitor the progress of the etch process. Both aspects result in the performance of the testing of the etching of the isolation trenches and that it is ensured that the complete etching is achieved, while not using an unduly long etch time period. A subsequent measurement of the trench depth in the active region is also achieved by means of the test structure.

In an alternative test structure, which is not explicitly illustrated, all of the continuous island regions A to E are bordered at the outer side with respect to the substrate region S by a trench width corresponding to at least the width e of the broadest trench. In this way, each of the islands is separated from the remaining substrate region S in an early stage so that the common sections between the respective islands, that is, the widths a to e, are only available for the control measurements. During the etching or a step of the etch process a frame-like separation of the individual islands from the substrate region at an early stage is achieved by a fast etching down of the broadest trench and a subsequent staged successive etching of the remaining trench sections of step-wise narrower width between the individual islands.

The illustrated coordination (mapping) of the trench width of the trench 19 corresponding substantially to the width of the trench structure 8 (without the insulating layer 5 and fill layer 4) of FIG. 3, is substantially located in a central position of all trench widths of FIG. 1a.

The tests in view of an appropriate trench depth are performed in a non-destroying manner, and after the formation of the trench structure no further processing steps are necessary that involve the wafer and the manufacturing processes of the wafer.

With respect to the electric measurement, a high accuracy of the resistance measurement may not be required, after the dimensions of the depth of the trench and the residual fin are to be measured, rather, an interpretation is required for obtaining a possible threshold. A very high and characteristic resistance value, representing an isolation trench etched down to the oxide layer, is to be distinguished from a low resistance obtained when a residual fin is still remaining. The determination of this may be accomplished in an efficient and rapid manner.

The invention claimed is:

1. A test structure for verifying an isolation trench etching in an SOI wafer, wherein the test structure in the SOI device comprises, after etching of isolation trenches, a row of islands, each of which is surrounded by a trench, said trenches having increasing trench width from one island to a next island and including a certain trench width of another isolation trench of an active circuit away from the test structure;
   wherein a portion of the surrounding trench (a,b) of each island shares a common portion with the surrounding trench of the adjacent island;
   wherein the respective common portion—except for an island having a broadest (e) or a narrowest (a) isolation trench—has the width of the adjacent surrounding trench having a next larger or a next smaller measure of width in the row.

2. A method of verifying insulation trench etchings or isolation trench etchings in SOI substrates, the method comprising:
   forming a test structure comprising a row of successive islands during an etch process or preparing the test structure for an etch process and measuring an electric pass several times during or after said trench etching;
   wherein a plurality of measurements of the electric pass are performed to provide a plurality of measurement values;
   wherein one of the measurements is performed between two adjacent first islands (A,B), a further measurement is performed between a different set of adjacent islands (B,C);
   using the measurement values of said plurality of measurements for assessing a sufficient or appropriate depth of etched insulation trenches or isolation trenches located outside said test structure in an area of an active circuit in the SOI substrate.

3. The method of claim 2, wherein said test structure comprises, after etching of isolation trenches, a row of associated islands, each of which is surrounded by an isolation trench, said trenches having increasing width from island to island and including one isolation trench having a width corresponding to a width of an isolation trench associated to an active circuit;
   wherein a portion of the surrounding trench (a,b) of each first island (A,B) has a common portion with a surrounding trench of an island located adjacent to said first island;
   wherein the common portion has a width being the larger width of the widths of both concerned surrounding trenches.

4. The method of claim 2, wherein said electric pass is a resistance or a conductance.

5. The method of claim 2, wherein said electric pass is a current at a constant voltage or a voltage at a constant current.

6. The method of claim 2, wherein the measurements are performed during the etching as etch process, and wherein the etch process is interrupted to perform a measurement between the islands or between an island and a surrounding crystal region.

7. The method of claim 2, wherein at least three, five, or more island regions are rowed up and functionally associated with each other.

8. The method of claim 2, wherein after the etch process the measurement values are evaluated, and wherein further etch processes of following SOI wafers are adapted to a result of the evaluation with respect to a targeted etch time.

9. The method of claim 6, wherein the etching as etch process is continued when the measurement for a certain trench in the test structure having a certain width (d) corresponding to a width of a trench in the active circuit indicates that the certain trench is not completely etched through to the insulating layer of the SOI substrate.

10. The method of claim 6, wherein the etching is stopped, when a trench surrounding an island of the test structure and having a width (d) corresponding to an isolation trench in the active circuit is etched through to the insulating layer, as determined by at least two measurements.

11. A method for verifying an insulation trench etching in an SOI substrate, comprising:
preparing a test structure (A,B,D,E) above a substrate of the SOI substrate and forming the test structure during a trench etching, measuring after or during said trench etching an electric pass between islands of the test structure, or between an island (A,B) and a substrate region (S) at least partially surrounding said island of the test structure; and
using the measurement results for assessing or detecting an appropriate depth of etched trenches located outside said test structure but being formed during said trench etching.

12. The method of claim 11, wherein at least three, five, or more island regions are rowed up and functionally associated with each other.

13. The method of claim 11, wherein a maximum number of measurements corresponds to the number of islands in the test structure.

14. The method of claim 11, wherein said test structure comprises, after etching of isolation trenches, a row of associated islands, each of which is surrounded by an isolation trench, said trenches having increasing width from island to island and including one isolation trench having a width corresponding to a width of an isolation trench associated to an active circuit;
wherein a portion of the surrounding trench of each first island has a common portion with a surrounding trench of an island located adjacent to said first island;
wherein the common portion has a width being the larger width of the widths of both concerned surrounding trenches.

15. The method of claim 11, wherein said electric pass is a resistance or a conductance.

16. The method of claim 11, wherein said electric pass is a current at a constant voltage or a voltage at a constant current.

17. The method of claim 11, wherein the measurements are performed during the etching as etch process, and wherein the etch process is interrupted to perform a measurement between the islands or between an island and a surrounding crystal region.

18. The method of claim 17, wherein the etching as etch process is continued when the measurement for a certain trench in the test structure having a certain width corresponding to a width of a trench in an active circuit indicates that the certain trench is not completely etched through to the insulating layer of the SOI substrate.

19. The method of claim 17, wherein the etching is stopped, when a trench surrounding an island of the test structure and having a width corresponding to an isolation trench in an active circuit is etched through to the insulating layer, as determined by at least two measurements.

20. A method for verifying insulation trench etchings in SOI wafers, wherein as active circuits dedicated devices or complete circuit modules are laterally dielectrically isolated by enclosing insulation trenches to form specific regions and a surrounding crystal region;
wherein a test structure is prepared on said SOI wafer for allowing a verification of at least one electric pass during a process step of insulation trench etching, the electric pass verification applied between at least one of:
specific regions (A,B; B,C) of the test structure; and
a specific region of the test structure and the surrounding crystal region (S);
the method further comprising:
preparing the test structure on the SOI wafer, said test structure having a row of functionally associated test islands after the trench etching process as said specific regions, each island being surrounded by a trench having a different width at least between respective two of said test islands;
wherein a relevant width of an insulation trench provided in the active circuits is positioned approximately in a central location within said row of test islands;
after the etch process, assessing a proper etch process result by repeatedly measuring an electric pass between respective two adjacent islands or between a respective island and the surrounding region (S) of said respective island;
using detected measurement values of the measurings as a measure or a test for a target depth as predefined depth of etched isolation trenches in the active circuits.

21. The method of claim 20, wherein the width of each trench surrounding a respective island in the row of test islands increases in a step-wise manner from island to island.

22. The method of claim 20, wherein the width of the insulation trench provided for the active circuits is a predefined value as a relevant insulation trench width.

23. The method of claim 20, wherein at least three, five, or more island regions are rowed up and functionally associated with each other.

24. The method of claim 20, wherein the step of preparing is performed by a predetermined mask for etching a row of test islands.

25. The method of claim 22, wherein, during successive verifications, it is started with an island having a surrounding trench width at least substantially corresponding to the relevant insulation trench width.

26. The method of claim 22, wherein the step of assessing is completed after at least two measurements, when an abrupt change of a pass value is obtained, and when measuring an adjacent pair of islands having smaller trench width does not exhibit said abrupt change.

27. The method of claim 26, wherein not more than n−1 measurements are performed for n islands, wherein n being the number of islands in said row.

* * * * *

UNITED STATES PATENT AND TRADEMARK OFFICE
CERTIFICATE OF CORRECTION

PATENT NO. : 7,588,948 B2
APPLICATION NO. : 10/552984
DATED : September 15, 2009
INVENTOR(S) : Ralf Lerner It is certified that error appears in the above-identified patent and that said Letters Patent is hereby corrected as shown below:

On the Title page under Assignee, the address of the assignee of the printed patent, "Efert (DE)" should appear as -- Erfurt (DE) --.

Signed and Sealed this

Twenty-second Day of December, 2009

David J. Kappos
*Director of the United States Patent and Trademark Office*